United States Patent
Hofer

[11] 3,936,531
[45] Feb. 3, 1976

[54] MASKING PROCESS WITH THERMAL DESTRUCTION OF EDGES OF MASK

[75] Inventor: Peter H. Hofer, Berkeley Heights, N.J.

[73] Assignee: Union Carbide Corporation, New York, N.Y.

[22] Filed: May 1, 1973

[21] Appl. No.: 356,214

[52] U.S. Cl. .................. 427/49; 427/154; 427/226
[51] Int. Cl. .............................................. B49d 1/52
[58] Field of Search ........ 117/8.5, 37 R, 38, 46 CA, 117/46 CC, 93, 93.1 DH, 106 R, 93.2, 46 R

[56] References Cited
UNITED STATES PATENTS

| | | | |
|---|---|---|---|
| 3,301,707 | 1/1967 | Loeb et al. | 117/227 |
| 3,342,754 | 9/1967 | Gorham | 260/2 |
| 3,379,803 | 4/1968 | Tittmann et al. | 264/81 |
| 3,472,795 | 10/1969 | Tittmann et al. | 260/2 |

Primary Examiner—Thomas J. Herbert, Jr.
Assistant Examiner—Bruce H. Hess
Attorney, Agent, or Firm—William Raymond Moran

[57] ABSTRACT

A masking process for masking a defined area on the surface of a substrate which is to be coated with a combustible coating material which comprises using as the masking means, a combustible masking material having a heating element enveloped therein along the edges thereof, coating the masked substrate with the coating material, decomposing the coating material and the masking material at the edges of the latter with the heating element, and then removing the remaining coated masking material and the heating element.

27 Claims, 8 Drawing Figures

3,936,531

MASKING PROCESS WITH THERMAL DESTRUCTION OF EDGES OF MASK

I. BACKGROUND OF THE INVENTION

1. Field of the Invention

The invention relates to the coating of partially masked substrates which coatings formed from combustible coating materials.

2. Description of the Prior Art

Various types of combustible coatings are applied to substrates to coat such surfaces. One class of such combustible coating materials is the paraxylylene polymers which are formed from a vaporous diradical which is condensed to form the polymer. These polymers are commonly employed to coat or encapsulate various types of substrates. In some applications, it is necessary to mask defined areas on certain types of substrates in order to prevent the deposition of the coating on such defined areas during the coating operation. Such substrates which must be masked for this purpose include electrical circuit boards, hybrid circuits, and electrical components and modules. It may also be necessary to mask non-electrical substrates which require a masking/demasking operation in conjunction with the use of adhesives in an assemblying operation.

The exposed electrical contacts and connectors on the surface of circuit board substrates must be masked, for example, before the coating operation, and the masking must be removed by mechanical stripping before the coated substrate can then be put to its intended use. The cost incurred heretofore by the masking/demasking process can account, in many applications, for at least about 20 to 50 percent of the total cost of the coating.

Such costs have curtailed, to some extent, the use of these coating materials for various coating applications which could not stand such costs. A more simplified and effective masking process was sought, therefore, in order to expand the field of use of these coating materials.

SUMMARY OF THE INVENTION

It has now been found that a relatively simple and effective masking process is provided when coating a portion of the surface of a substrate with a coating formed from a combustible coating material, by first masking, with a combustible masking material having heating element means enveloped therein at the edges thereof, that portion of the surface which is not to be coated, then applying the coating material over the masked and unmasked surfaces of the substrate, then decomposing the coating material and the masking means at the edges of the latter with the heating element means, and then removing the remaining coated masking material and the heating element means.

An object of the present invention is to provide a masking process which will facilitate the use of coatings formed from combustible coating materials.

II. DESCRIPTION OF THE PREFERRED EMBODIMENT

Figure 1:
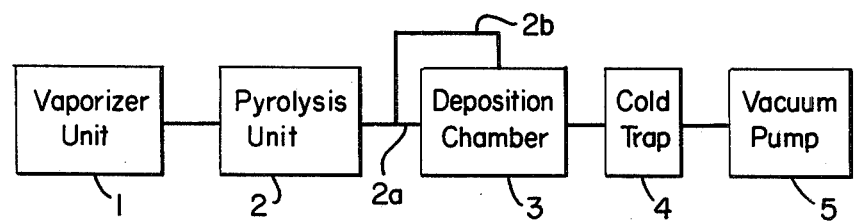
FIG. 1 shows a schematic flow sheet of a p-xylylene polymer coating device arrangement.

1. The Basic Process of the Present Invention

The basis process of the present invention may be more explicitly defined as a masking process for masking a defined area on the surface of a substrate which is to be coated with a combustible coating material which comprises providing heating element means along the edges of such defined area placing combustible masking means over such defined area and such heating element means, applying the combustible coating material to the surface of the substrate so as to coat the unmasked area of such surface and at least those portions of the surface of the combustible masking means which cover the heating element means, heating the heating element means to a temperature and for a period of time sufficient to decompose the combustible masking means and the combustible coating material along the edges of such defined area, and then removing the remaining combustible masking means and the heating element means from the substrate.

A combustible material means, for the purposes of the present invention, one which, when subjected to temperatures of > 25°C can be made to, when subjected to such temperature for a sufficient period of time, progressively decompose by oxidation, as evidenced by the appearance of carbonyl groups in the infra red spectrum analysis of gaseous products formed during the oxidation decomposition of such combustible material. The progressive oxidative degradation or decomposition of the combustible material should procede, for the purposes of the present invention, at least to the point where such combustible material suffers a loss, at a temperature of > 25°C, of at least about 125 percent, and preferably of at least 200 percent, in the elongation value of such combustible material as measured at 25°C by ASTM procedure D-882-56T. The progressive oxidative degradation or decomposition of the combustible material can be allowed to proceed to the point where the combustible material is completely burned-off, or vaporized, by oxidation. The progressive degradation can also be accomplished in the absence of oxygen by pyrolytic decomposition.

The preferred of the combustible coating materials for use in the process of the present invention are linear para-xylylene polymers, and the remaining description of the present invention will be principally based on the use of such polymers in this process.

2. GENERAL PREPARATION OF PARA-XYLYLENE POLYMERS

Linear para-xylylene polymers are usually prepared by condensing, in a condensation zone, vapors of p-xylylene monomers which can be produced by the pyrolytic cleavage, in a pyrolysis zone, of one or more cyclic dimers represented by the following structure:

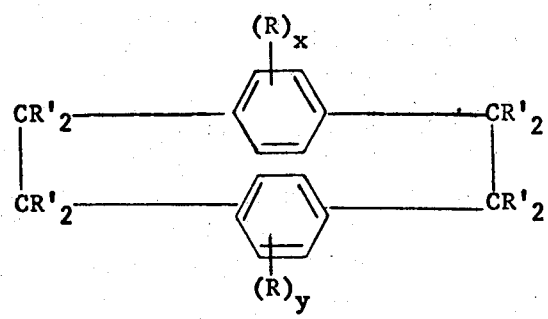

wherein R is an aromatic nuclear substituent, $x$ and $y$ are each integers from 0 to 3, inclusive, and R' is H, Cl and/or F. The thus formed vaporous p-xylylene moiety may be in the form of diradicals having the structures

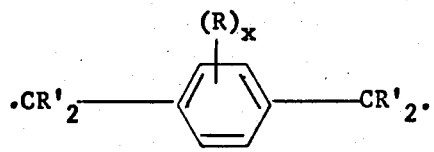

and

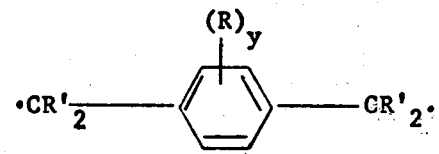

and/or moieties having the tetraene or quinoid structures:

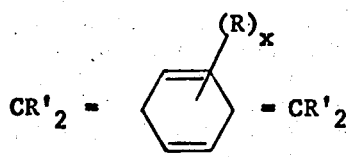

and

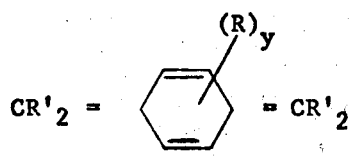

It is believed that the tetraene or quinoid structure is the dominant structure which results when the dimer is pyrolyzed, but that the monomer polymerizes as though it were in the diradical form.

Thus, where x and y are the same, and the aromatic nuclear substituent on each monomer is the same, and all the R's are the same, two moles of the same p-xylylene monomer are formed, and when condensed, yield a substituted or unsubstituted p-xylylene homopolymer. When $x$ and $y$ are different or the aromatic nuclear substituents on each p-xylylene monomer are different, or the R's are different, condensation of such monomers will yield copolymers as hereinafter set forth. Examples of the R substituent groups which may be present in the dimers and monomers are organic groups such as alkyl, aryl, alkenyl, cyano, alkoxy, hydroxy alkyl, carbalkoxy and like radicals and inorganic radicals such as hydroxyl, halogen and amino groups. COOH, $NO_2$ and $SO_3H$ groups may be added as R groups to the polymer after it is formed. The unsubstituted positions on the aromatic rings are occupied by hydrogen atoms.

The particularly preferred substituent R groups are the $C_1$ to $C_{10}$ hydrocarbon groups, such as the lower alkyls, i.e., methyl, ethyl, propyl, butyl and hexyl, and aryl hydrocarbons such as phenyl, alkylated phenyl, naphthyl and like groups; and the halogen groups, chlorine, bromine, iodine and fluorine. Hereinafter the term "a di-p-xylylene" refers to any substituted or unsubstituted cyclic di-p-xylylene as hereinabove discussed.

Condensation of the p-xylylene monomers to form the p-xylylene polymers can be accomplished at any temperature below the decomposition temperature of the polymer, i.e., at < 250°C. The condensation of the monomers will proceed at a faster rate, the colder is the substrate on which the condensation is to take place. Above certain temperatures, which might be defined as a ceiling condensation temperature, the monomers will condense at rates which are relatively slow for commercial applications. Each has a different ceiling condensation temperature. For example, at 0.5 mm Hg pressure the following condensation and polymerizations ceilings are observed for the following monomers:

|   | Degrees centigrade |
|---|---|
| p-Xylylene | 25–30 |
| Chloro-p-xylylene | 70–80 |
| Cyano-p-xylylene | 120–130 |
| n-Butyl-p-xylylene | 130–140 |
| Iodo-p-xylylene | 180–200 |

Thus, homopolymers may be made by maintaining the substrate surface at a temperature below the ceiling condensation temperature of the particular monomer species involved, or desired in the homopolymer. This is most appropriately termed "homopolymerizing conditions."

Where several different monomers existing in the pyrolyzed mixture have different vapor pressure and condensation characteristics as for example p-xylylene, or cyano-p-xylylene and chloro-p-xylylene, or any other mixture thereof with other substituted p-xylylenes, homopolymerization will result when the condensation and polymerization temperature is selected to be at or below that temperature at which only one of the monomers condenses and polymerizes. Thus, for the purpose of this invention the term "under homopolymerization conditions" is intended to include thos conditions where only homopolymers are formed.

Therefore it is possible to make homopolymers from a mixture containing one or more of the substituted monomers when any other monomers present have different condensation or vapor pressure characteristics, and wherein only one monomer species is condensed and polymerized on the substrate surface. Of course, other monomer species not condensed on the substrate surface can be drawn through the apparatus as hereinafter described in vaporous form to be condensed and polymerized in a subsequent cold trap.

Inasmuch as the p-xylylene monomers, for example, are condensed at temperatures of about 25° to 30°C., which is much lower than that at which the cyano p-xylylene monomers condense, i.e., about 120° to 130°C., it is possible to have such p-xylylene monomers present in the vaporous pyrolyzed mixture along with the cyano-substituted p-xylylene monomers when a homopolymer of the substituted dimer is desired. In such a case, homopolymerizing conditions for the cyano p-xylylene monomers are secured by maintaining the substrate surface at a temperature below the ceiling condensation temperature of the substituted p-xylylene but above that of the unsubstituted p-xylylene; thus permitting the unsubstituted p-xylylene vapors to pass through the apparatus without condensing and polymerizing, but collecting the poly-p-xylylene in a subsequent cold trap.

It is also possible to obtain substituted copolymers through the pyrolysis process hereinabove described. Copolymers of p-xylylene and substituted p-xylylene monomers, as well as copolymers of substituted p-xylylene monomers wherein the substituted groups are all the same radicals but wherein each monomer contains a different number of substituent groups, can all be obtained through such pyrolysis process.

Copolymerization also occurs simultaneously with condensation, upon cooling of the vaporous mixture of reactive monomers to a temperature below about 200°C. under polymerization conditions.

Copolymers can be made by maintaining the substrate surface at a temperature below the ceiling condensation temperature of the lowest boiling monomer desired in the copolymer, such as at room temperature or below. This is considered "copolymerizing conditions," since at least two of the monomers will condense and copolymerize in a random copolymer at such temperature.

In the pyrolytic process, the reactive monomers are prepared by pyrolyzing a substituted and/or unsubstituted di-para-xylylene at a temperature less than about 750°C., and preferably at a temperature between about 600°C. to about 680°C. At such temperatures, essentially quantitative yields of the reactive monomers are secured. Pyrolysis of the starting di-p-xylylene begins at about 450°C. regardless of the pressure employed. Operation in the range of 450°–550°C. serves only to increase the time of reaction and lessen the yield of polymer secured. At temperatures above about 750°C., cleavage of the substituent group can occur, resulting in a tri-/or polyfunctional species causing cross-linking or highly branched polymers.

The pyrolysis temperature is essentially independent of the operating pressure. It is preferred, however that reduced or subatmospheric pressures be employed. For most operations, pressures within the range of 0.0001 to 10 mm Hg absolute are most practical. However, if desired, greater pressures can be employed. Likewise, if desirable, inert vaporous diluents such as nitrogen, argon, carbon dioxide, steam and the like can be employed to vary the optimum temperature of operation or to change the total effective pressure in the system.

When the vapors condense on the substrate to form the polymer, i.e., coating, the coating forms as a continuous film of uniform thickness. The coatings are transparent and pinhole free. Thickness of the coating can be varied by various procedures, as by varying the amount of dimer used, and by varying the reaction temperature, time, pressure and substrate temperature.

In addition to the linear para-xylylene polymers, other combustible coating materials may be used in the process of the present invention.

3. MASKING MEANS

The masking means which is used in the process of the present invention to mask those areas of the surface of the substrate which are not to be coated include all the conventional combustible masking means such as masking tape, paper, polyethylene, vinyl resins, polytetrafluoroethylene resins, acetate resins, cellophane, woven tapes, foils, silicone rubber, and laminates made of resins such as epoxy resins, polyester resins, and phenolic resins. These laminates may be made with or without structural reinforcing elements.

Adhesives, clamps, clips, spring loaded holders, shrinkfit devices and the like, may be used to secure the masking means to the surfaces being coating the coating operations.

The masking means may be used in the form of thin sheets or film which are about 0.0005 to 0.020 inches thick, or in the form of thicker sleeves, templates, and the like. The masking means may be molded or machined to conform to the configuration of the substrate being masked therewith.

4. HEATING ELEMENT

As noted above, at the edges of the masking means there is provided, usually by enveloping it therein, a heating element. Such heating element means would include thermal conductors such as strips or wires of aluminum, iron, copper and brass.

The heating element means may also be an electrical conductor or semi-conductor such as one made of copper, aluminum, inconel, nichrome, and tungsten.

The electrical conductors and semi-conductors can be heated by applying a voltage therethrough.

The heating element means are relatively thin materials having a diameter or width of about 0.001 to 0.010 inches.

The heating element means should be capable of providing the desired temperature needed to decompose the masking material and the coating material. The required temperatures are of the order of about ≥ 250°C, and preferably of the order of about 750°–1000°C.

5. MASKING PROCESS

Thus the masking process of the present invention can be more specifically defined as a process for masking a defined area on the surface of a substrate during the coating of such surface with a combustible coating material so as to prevent the coating of the defined area with the combustible coating material which comprises applying combustible masking means onto the defined area so as to cover such defined area, the combustible masking means having heating element means enveloped therein along the edges thereof which define the defined area, such heating element means being adapted to being heated to a temperature at which the combustible masking means and the combustible coating material can be partially or completely decomposed, applying the combustible coating material to the surface of the substrate so as to continuously coat the unmasked areas of the surface and at least those portions of the surface of the combustible masking means which envelope the heating element means, heating the heating element means at a temperature and for a period of time sufficient to decompose the combustible masking means and the combustible coating material at the edges of the defined area, and then removing the remaining combustible masking means and the heating element means from the substrate.

A more detailed understanding of the masking process of the present invention, in which para-xylylene polymers are employed, in a vapor deposition coating process, as the coating materials, may be obtained by now referring to the drawings.

FIG. 1 shows a schematic view of various parts of equipment that may be used, in combination, in carrying out the masking process of the present invention. Thus, the vaporization of the p-xyxylene dimer is conducted in a vaporizer unit 1. The vapors are then conducted to a pyrolysis unit 2 for the purposes of pyrolyzing the vaporous cyclic dimer to form, per mol of dimer, two mols of the p-xylylene moiety. The p-xylylene vapors are then passed into deposition chamber 3, wherein the novel process of the present invention is essentially conducted. Unreacted p-xylylene vapors pass through deposition chamber 3 into a cold trap 4 where they are condensed. The entire series of elements 1 through 4 is connected in series to vacuum pump 5 which is used to maintain the desired pressure conditions throughout the interconnected system of devices, and also to help cause the dimer and p-xylylene vapors to flow in the desired direction. Valves may be inserted between the adjoining devices in the system to regulate the flow of the vapors.

For the purposes of the present invention the p-xylylene vapors are usually fed to deposition chamber 3 through the side thereof, through line 2a, and/or through the top thereof, through line 2b.

Figure 2:
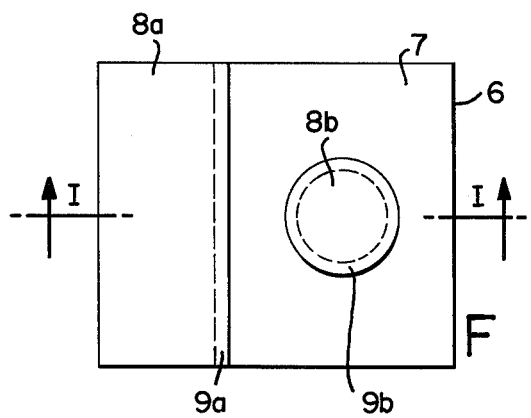
FIG. 2 shows a top view of a circuit board with a portion of the surface thereof masked in accordance with the present invention.

FIG. 2 shows a top view of a circuit board 6 having an upper surface 7. On upper surface 7 there are placed masking means 8a and 8b. These masking means are used to protect the underlying areas of surface 7 from being coated with para-xylylene polymer during the coating operation. Underneath those edges of masking means 8a and 8b which are not coextensive with the edges of the circuit board there are placed heating elements 9a and 9b, respectively. The underlying position of these heating elements is shown by dotted lines on the inner edge of masking means 8a and on the entire edge of masking means 8b.

Heating element means 9a and 9b are attached to suitable leads, not shown, for the purposes of supplying the necessary heat to such heating element means.

Figure 3:
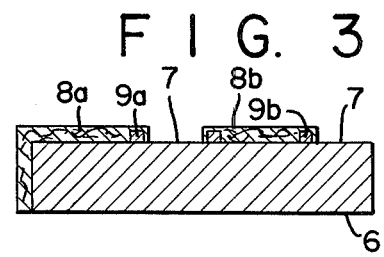
FIG. 3 shows a cross section of the masked circuit board of FIG. 2 through section I-I thereof.

FIG. 3 shows a cross section of circuit board 6, prior to the coating operation, through section I—I of the uncoated circuit board as seen in FIG. 2. In FIG. 3 heating elements 9a and 9b are shown lying on the surface 7 of circuit board 6 with the tops and sides thereof covered or enveloped by masking means 8a and 8b respectively. The heating elements may also be further enveloped by the masking means by having the edges of the masking means placed under the heating elements. Masking means 8a extends down along the length of one side of circuit board 6.

The surface 7 of circuit board 6 usually contains exposed electrical elements such as electrical connectors, or electrical devices such as diodes, transistors, integrated circuit chips, capacitors, resistors, and the like.

The existence and possible positioning of such electrical elements is not shown since it is not necessary for a proper understanding of the invention. The electrical elements which are to be coated with the coating material, however, are generally positioned within the unmasked areas of surface 7. To avoid coating such exposed electrical elements during the coating process, therefore, the surface 7 of circuit board must be masked accordingly, and the configuration of the masking means can be readily tailored to accomplish this end.

Where it is necessary to lay a heating element means directly, or entirely enveloped within the edges of the masking means, over the surface of an exposed electrical element on surface 7, suitable thermal or electrical insulation should be inserted, where necessary, between such exposed electrical elements and the heating element means so as to avoid damaging the exposed electrical elements during the heating of the heating element means.

When masking means 8a and 8b, and heating element means 9a and 9b, are in place on surface 7, the thus assembled circuit board is coated with para-xylylene polymers in deposition chamber 3 by allowing p-xylylene dimer vapors to condense and polymerize, as disclosed above, on the exposed surface 7 of circuit board 6 and on the surfaces of masking means 8a and 8b. As a result, a continuous coating of para-xylylene polymer forms over such surfaces.

Figure 4:
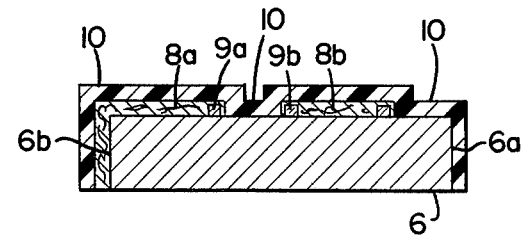
FIG. 4 shows a cross section of the masked circuit board of FIG. 2, through section I-I thereof, after the coating operation.

FIG. 4 shows a cross section of circuit board 6 after such coating operation through section I—I of the circuit board as seen in FIG. 2. The unmasked surface 7 of circuit board 6, as well as the surfaces of masking means 8a and 8b, are now coated with a continuous coating 10 of para-xylylene. Heating elements 9a and 9b are still enveloped in masking means 8a and 8b, respectively.

Under the usual coating conditions employed in coating substrates in a vapor deposition process with coating materials such as para-xylylene polymers, all the exposed, unmasked, surfaces of the object being coated, top sides and/or bottom, are usually coated. In the case of circuit board 6, the bottom of it was not coated, since the bottom was not exposed to the coating vapors. The unmasked side 6a of circuit board 6 was coated with coating 10 during the coating process, whereas the masked side 6b of the board was only coated on the mask, and not on such side of the board itself.

After the coating operation, heating elements 9a and 9b are then heated up, through their leads, to a temperature, and for a period of time, as is necessary, oxidatively to decompose those areas of the masking means and the coating means which are adjacent and above the heating element. This decomposition operation can also be conducted in deposition chamber 3, before removing the coated circuit board therefrom, if the necessary leads were attached to the heating elements before the masked circuit board was first inserted into the deposition chamber. The width of the decomposed area of the coating material usually amounts to about 1.5 to 2 times the width of the heating element, with the width of the heating element itself, included in such area.

The decomposition operation can be conducted at a temperature and for a period of time as is sufficient to completely oxidize and burn-off the coating material, and masking means which covers, and/or is adjacent to, the heating element. The heating element can then be readily removed from the substrate. The heating element itself can also, of course be removed by a complete oxidative decomposition thereof.

The decomposition operation can also be conducted at a temperature and for a period of time as is sufficient to cause the coating material, and masking means, which covers, and/or is adjacent to, the heating element to suffer a loss of elongation value (as measured at 25°C) of > 125 percent, and preferably of at least 200 percent, without causing a complete oxidation of such coating material and such masking means. The partially decomposed coating material and masking means can then be readily torn by a shearing force, and removed from the substrate. The heating element can then also be readily removed.

The removal of the partially or completely decomposed portions of the coating material and the masking means as described above, does not impair the integrity of the adhesion of the coating remaining on the substrate itself, or on the remaining masking means.

Figure 5:
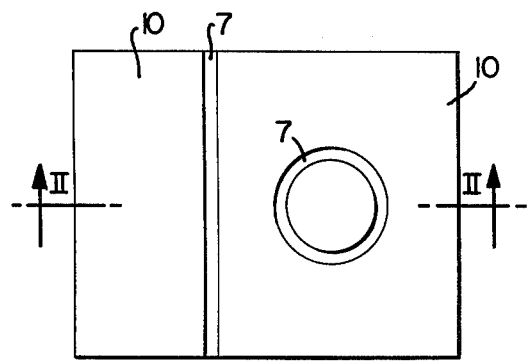
FIG. 5 shows a top view of the circuit board of FIG. 2 after the coating operation, after the burning off of the masking material and the coating material thereon, and after the removal of the heating elements.
Figure 6:
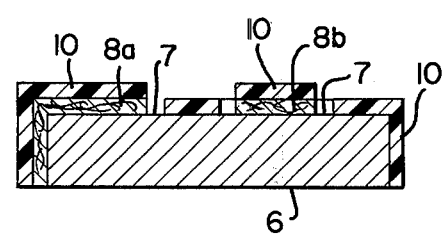
FIG. 6 shows a cross-section of the masked circuit board of FIG. 5, through section II-II thereof.

FIG. 5 shows a top view, and FIG. 6 shows a cross-section through section II—II of FIG. 5, of coated circuit board 6 after the decomposition operation and after the removal of the heating elements. Thus FIGS. 5 and 6 show the decomposed path provided in and through coating 10 by the heating elements, along the edges of masking means 8a and 8b.

Figure 7:
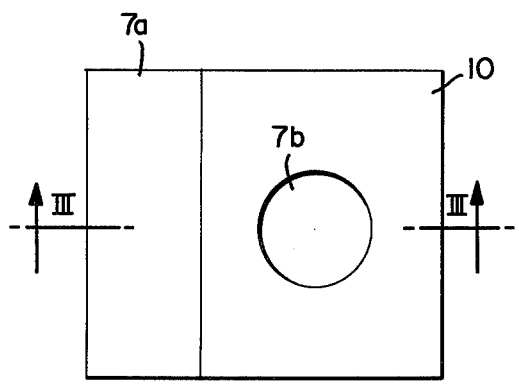
FIG. 7 shows a top view of the coated circuit board of FIG. 5, after the masking has been removed.
Figure 8:
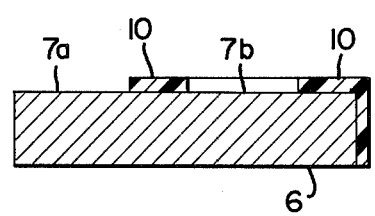
FIG. 8 shows a cross-section of the coated circuit board of FIG. 7, through Section III-III thereof.

FIG. 7 shows a top view, and FIG. 8 shows a cross section through Section III—III of FIG. 7, of coated circuit board 6 after the decomposition operation, and, further, after the removal of coated masking means 8a and 8b. Coating 10 now covers only that portion of surface 7 which was directly exposed to the coating vapors. Surface areas 7a and 7b of circuit board 6 are not coated with para-xylylene polymer, and they are those areas which were respectively covered for the most part by masking means 8a and 8b.

In all the drawings the relative dimensions of the elements are not drawn to scale in order to readily described the present invention. In practice, coatings 10 are usually of the order of about 2 to 30 microns thick where para-xylylene polymers are employed as the coating materials. Thicker coatings of the order of about 100 to 250 microns, may be used with other coating materials.

The process of the present invention can thus be even more specifically defined, with respect to the use of para-xylylene polymer as the coating material, as a process for masking a defined area on the surface of a substrate during the coating of such substrate with para-xylylene polymer so as to prevent the coating of the defined area with such polymer, which comprises applying combustible masking means to the defined area so as to cover such defined area, the combustible masking means having heating element means enveloped therein along the edges thereof which define the defined area, such heating element means being adapted to being heated to a temperature at which the combustible masking means and the polymer can be partially or completely decomposed, applying the polymer, in a vapor deposition process, as a coating over the masked and unmasked areas of the surface of the substrate, heating the heating element means to a temperature and for a period of time sufficient to decompose the combustible masking means and the polymer at the edges of the defined area, and then removing the remaining combustible masking means and the heating element means from the surfaces of the substrate.

6. EXAMPLES

The following examples are merely illustrative of the process of the present invention and are not intended as a limitation upon the scope thereof.

EXAMPLES 1 – 3

A series of three experiments were conducted to illustrate the process of the present invention. For each experiment a blank circuit board substrate was masked, coated and demasked in accordance with the present invention. The substrate was a 3 inch × 8 inch × 1/16 inch glass fiber reinforced phenolic resin laminate which is commonly used as a circuit board substrate. The substrate was devoid of any electrical circuitry.

The masking means and heating element means used in each experiment were as follows:

| Example | Masking Means | Heating Element Means |
|---|---|---|
| 1 | teflon tape 1" wide 0.004" thick | 30 gauge nichrome wire, 6" long, 0.010" in diameter |
| 2 | paper tape 1" wide 0.005" thick | inconel wire 6" long 0.003" in diameter |
| 3 | black vinyl electrical tape 3/4" wide 0.007" thick | 22 gauge nichrome wire, 6" long, 0.025" in diameter |

The masking means used in each experiment had an adhesive backing which allowed the tape to be adhesively bonded to the substrate and to the heating element.

In each experiment a single width of the tape, i.e., the masking means, was used to mask one of the 3 inch wide ends of the upper surface of the substrate, with the heating element running under the inner (with respect to the surface of the substrate) edge of the tape, in the positions corresponding to those of masking means 8a and heating element means 9a as shown in FIGS. 2 and 3 of the drawings. About 1½ inches of the heating element means also extended beyond each of the top and bottom, as seen in FIG. 2, edges of surface 7 of circuit board 6. These 1½ inch leads were subsequently attached to a source of electricity which was used to supply the voltage necessary to heat the heating element, as described below.

In each experiment the masked substrate was then placed in a para-xylylene polymer coating deposition chamber and the masked and unmasked surface of the substrate was then coated with a continuous coating of polychloro-para-xylylene which was about 0.0005 to 0.0007 inches thick.

The coating was supplied in each experiment by charging about 35 grams of chloro-para-xylylene monomer to a vaporizer unit and vaporizing and pyrolyzing the monomer, and condensing the resulting diradical on the substrate being coated in the deposition chamber, as described above. During the coating operation the following conditions prevailed in the coating apparatus in each experiment:

| | |
|---|---|
| vaporizer unit temperature | 200°C |
| pyrolysis unit temperature | 650°C |
| deposition chamber pressure | 30–90 microns |
| cold trap temperature | −86°C |
| vacuum pump | 3 microns |

After the coating operations, the coated substrates were removed from the deposition chamber and the leads from the heating elements (which elements were now coated by both the masking means and the polychloro-para-xylylene coating as shown in FIGS. 5 and 6 of the drawings) were now attached to a source of electric power, through a transformer, and a voltage was applied to the heating element to heat it to a red heat ( ≥ 900°F) under the following conditions:

| Example | Primary Voltage of Transformer (volts) | Secondary Voltage, to heating element (volts) | Current, to heating element, (amperes) | Time the voltage applied, (seconds) |
|---|---|---|---|---|
| 1 | 50 | 8.2 | 3.0 | 2 |
| 2 | 20 | 3.3 | 1.0 | 5 |
| 3 | 50 | 8.2 | 2.8 | 1 |

The thus heated heating elements completely burned through the overlying and adjacent masking tape and polymeric coating. The short heating time did not necessitate the use of insulation between the heating element and the substrate surface. The heating element was then removed, leaving a continuous uncoated path in the polymeric coating, as shown in FIGS. 5 and 6, which was about twice the width of the heating element. The coated masking means was then stripped from the substrate leaving the unmasked areas of the substrate coated with a continuous coating, as shown in FIGS. 7 and 8. The adhesion of the remaining coating, to the unmasked substrate, was not impaired by the heating of the heating element.

As discussed above the present invention contemplates having the heating element means enveloped in one end of the masking means. It is also possible for the heating element means to be placed outside of, and along the edge of, the masking means. Thus, as seen in FIGS. 2–4 of the Drawings, heating element 9a need not be covered by the overlapping end of masking means 8a, but need only be there, in place, along the edge of masking means 8a. When the coating 10 is applied, it will directly coat both the masking means and the heating element means. Then, the heating element need only be heated to a temperature, and for a period of time, as is sufficient to decompose the overlying and adjacent coating. The heating element can then be removed, leaving the circuit board as seen in FIGS. 5 and 6.

The process of the present invention can then also be defined as a process for masking a defined area on a substrate which is to be coated with a combustible coating material which comprises providing heating element means along the edges of such defined area, masking such defined area with combustible masking means, applying the combustible coating material to the substrate so as to continuously coat the unmasked area of such substrate, the heating element means, and at least those portions of the combustible masking means which edge the heating element means, heating the heating element means to a temperature and for a period of time as is sufficient to decompose the coating material which covers the heating element means, and removing the masking means and the heating element means from the substrate.

What is claimed is:

1. A process for masking a defined area on a substrate which is to be coated with a combustible coating material which suffers a loss at a temperature of > 25°C., of at least about 125 percent in the elongation value of such combustible material as measured at 25°C., which comprises providing heating element means along the edges of said defined area, placing combustible masking means over said defined area and said heating element means, applying the combustible coating material to the substrate so as to coat the unmasked area of said substrate and at least those portions of the combustible masking means which cover said heating element means, heating said heating element means to a temperature and for a period of time as is sufficient to decompose said masking means and said coating material along the edges of said defined area, and removing the remaining masking means and said heating element means from said substrate.

2. A process as in claim 1 in which said heating is sufficient to cause the complete decomposition of said masking means and said coating material along the edges of said defined area.

3. A process as in claim 2 in which said masking means comprises masking tape.

4. A process as in claim 3 in which said heating element means comprises an electrical conductor.

5. A process as in claim 1 in which said coating material comprises para-xylylene polymer.

6. A process as in claim 5 in which said coating material comprises poly-chloro-para-xylylene.

7. A process as in claim 5 in which said coating material is applied so as to provide a coating on said unmasked area of the substrate which is about 2 to 30 microns thick.

8. A process for masking a defined area on a substrate during the coating of said substrate with a combustible coating material which suffers a loss at a temperature of > 25°C., of at least about 125 percent in the elongation value of such combustible material as measured at 25°C., so as to prevent the coating of said defined area with said coating material, which comprises applying combustible masking means to said defined area so as to cover said defined area said combustible masking means having heating element means enveloped therein along the edges thereof which define said defined area, said heating element means being adapted to being heated to a temperature at which said combustible masking means and said combustible coating material can be partially or completely decomposed, applying the combustible coating material to said substrate so as to continuously coat the unmasked areas of said substrate and at least those portions of the combustible masking means which envelope said heating said heating element means, heating said heating element means to a temperature and for a period of time as is sufficient to cause the decomposition of said combustible masking means and said combustible coating material at the edges of said defined area, and removing the remaining combustible masking means and said heating element means from said substrate.

9. A process as in claim 8 in which said heating is sufficient to cause the complete decomposition of said masking means and said coating material along the edges of said defined area.

10. A process as in claim 9 in which said masking means comprises masking tape.

11. A process as in claim 10 in which said heating element means comprises an electrical conductor.

12. A process as in claim 8 in which said coating material comprises para-xylylene polymer.

13. A process as in claim 12 in which said coating material comprises poly-chloro-para-xylylene.

14. A process as in claim 12 in which said coating material is applied so as to provide a coating on said unmasked areas of the substrate which is about 2 to 30 microns thick.

15. A process for masking a defined area on a substrate during the coating of said substrate with para-xylylene polymer so as to prevent the coating of said defined area with said polymer, said defined area being less than the total coatable area of said substrate, which comprises masking said defined area with combustible masking means, said combustible masking means having heating element means enveloped therein along the edges thereof which define said defined area, said heating element means being adapted to being heated to a temperature at which said combustible masking means and said polymer can be partially or completely decomposed, applying said polymer, in a vapor deposition process, as a coating over the masked and unmasked areas of said substrate, heating said heating element means to a temperature and for a period of time as is sufficient to cause the decomposition of said combustible masking means and said polymer at the edges of said defined area, and removing the remaining combustible masking means and said heating element means from said substrate.

16. A process as in claim 15 in which said heating is sufficient to cause the complete decomposition of said masking means and said polymer along the edges of said defined area.

17. A process as in claim 16 in which said masking means comprises masking tape.

18. A process as in claim 17 in which said heating element means comprises an electrical conductor.

19. A process as in claim 15 in which said para-xylylene polymer comprises poly-chloro-para-xylylene.

20. A process as in claim 15 in which said polymer is applied so as to provide a coating on the unmasked areas of said substrate which is about 2 to 30 microns thick.

21. A process for masking a defined area on a substrate which is to be coated with a combustible coating material which suffers a loss at a temperature of > 25°C., of at least about 125 percent in the elongation value of such combustible material as measured at 25°C., which comprises providing heating element means along the edges of said defined area, masking said defined area with combustible masking means, applying the combustible coating material to the substrate so as to continuously coat the unmasked area of said substrate, said heating element means; and at least those portions of said combustible masking means which edge said heating element means, heating said heating element means to a temperature and for a period of time as is sufficient to decompose the coating material which covers said heating element means, and removing the masking means and said heating element means from said substrate.

22. A process as in claim 21 in which said heating is sufficient to cause the complete decomposition of said coating material along the edges of said defined area.

23. A process as in claim 22 in which said masking means comprises masking tape.

24. A process as in claim 23 in which said heating element means comprises an electrical conductor.

25. A process as in claim 21 in which said coating material comprises para-xylylene polymer.

26. A process as in claim 25 in which said coating material comprises poly-chloro-para-xylylene.

27. A process as in claim 25 in which said coating material is applied so as to provide a coating on said unmasked area of the substrate which is about 2 to 30 microns thick.

* * * * *